United States Patent [19]
Verlinden et al.

[11] Patent Number: 6,004,727
[45] Date of Patent: Dec. 21, 1999

[54] METHOD OF MAKING A LITHOGRAPHIC PRINTING PLATE

[75] Inventors: Bart Verlinden, Tongeren; Joan Vermeersch, Deinze; Patrick Van den Bergen, Hove, all of Belgium

[73] Assignee: Agfa-Gevaert, Mortsel, Belgium

[21] Appl. No.: 09/103,838

[22] Filed: Jun. 24, 1998

[51] Int. Cl.⁶ .............................. G03F 7/07; G03F 7/26; G03D 13/00; G03D 9/02
[52] U.S. Cl. ................... 430/302; 430/204; 430/403; 396/617; 396/620; 396/622
[58] Field of Search .................... 396/617, 622, 396/620; 430/204, 302

[56] References Cited

U.S. PATENT DOCUMENTS

| | | | |
|---|---|---|---|
| 5,210,005 | 5/1993 | Takekoshi et al. | 430/302 |
| 5,313,242 | 5/1994 | Devaney et al. | 396/617 |
| 5,689,750 | 11/1997 | Verlinden et al. | 396/622 |
| 5,737,662 | 4/1998 | Verlinden et al. | 396/617 |
| 5,799,224 | 8/1998 | Verlinden et al. | 396/622 |

FOREIGN PATENT DOCUMENTS

| | | |
|---|---|---|
| 0177890 | 10/1985 | European Pat. Off. . |
| 0260615 | 9/1987 | European Pat. Off. . |
| 2402231 | 3/1979 | France . |
| 1421451 | 10/1968 | Germany . |
| 3002732 | 8/1981 | Germany . |
| 19525777 | 2/1996 | Germany . |
| 62-087965 | 4/1987 | Japan . |
| 63-100460 | 5/1988 | Japan . |

*Primary Examiner*—Richard L. Schilling
*Attorney, Agent, or Firm*—Baker & Botts, L.L.P.

[57] ABSTRACT

An imaging element (15, 122) comprising on a lithographic base at least one radiation sensitive or heat-sensitive layer composition, is image-wise exposed to radiation or heat. The composition is such that when exposed and developed, a lithographic surface is formed. The exposed imaging element is then passed through a closed treatment cell (26, 64, 66) in a processing apparatus in which the imaging element is brought into contact with a single developing fluid (44, 124). The closed treatment cell (26; 64; 66) comprises a housing (24; 114) having an entrance (28; 116) and an exit (30; 118) each closed by a path-defining roller (32; 128) in contact with a reaction surface (33; 130) to form a nip (34; 136) therebetween, through which the plate path (36; 72) extends. Sealing means (38; 138, 139) seal each path-defining roller (32; 128) to the housing. Evaporation, oxidation and carbonization of the treatment liquid is significantly reduced and quality control of the plate is possible before mounting on a printing machine.

7 Claims, 3 Drawing Sheets

METHOD OF MAKING A LITHOGRAPHIC PRINTING PLATE

FIELD OF THE INVENTION

The present invention relates to a method of making a lithographic printing plate, in particular where the printing plate is processed with a single developing fluid.

BACKGROUND OF INVENTION

In German patent application DE 1 421 451 (A B Dick Company), a lithographic offset master is described comprising a base sheet having an ink repellant, water receptive, lithographic surface having a continuous coating of a dispersed phase of an ink receptive, water repellant imaging material uniformly distributed in a binder system. The coating is capable of displacement from the surface of the base sheet by solution or dispersion in water and/or alcohol. The printing plate is developed, for example, by wiping the plate with an etching composition.

Japanese patent application JP 63100460 (Konica Corp.), shows a method and apparatus for processing photosensitive material with improved stability or the like. Different developing liquids are used in two developing stations.

French patent application FR 2 402 231 (Beach manufacturing Corporation) describes a method and apparatus for automatically producing finished lithographic plates from supplies of blank plates and negatives. The plates are developed in a completely enclosed apparatus using a number of different liquids.

European patent application EP 0 260 615A (Hoechst AG), describes a compact device which can be attached to a conventional printing plate developing machine either as a correcting agent washing station or as a developing station. The developing machine has separate developing, rinsing and gumming stations.

European patent application EP 0 177 890A (Hoechst AG) describes a device for treating printing plates with a fluid. A single cell apparatus is shown for developing negative or positive printing plates of undisclosed form.

Methods of making lithographic printing plates are known, for example from European patent applications EP 0 769 724-A and EP 0 768 172-A (Agfa-Gevaert NV), which comprise the steps of:

(1) image-wise exposing to radiation an imaging element comprising on a plastic film support at least one radiation sensitive layer composition, the composition being such that when exposed and developed, a lithographic surface is formed; and (2) developing the thus obtained image-wise exposed imaging element on a printing press using a single developing fluid, for example with the fountain solution of the press.

This known method suffers from the disadvantage that quality control of the printing plate is not easily possible. Debris from the development process, which accumulates in the liquid which serves both as the developing fluid and the plate wetting fluid, may potentially disturb printing quality. Furthermore, this construction has the disadvantage that the treatment liquid may become contaminated by the environment, especially by evaporation, oxidation and carbonisation thereof.

OBJECTS OF INVENTION

It is an object of the invention to provide a method of making a lithographic printing plate wherein the aforesaid disadvantages are overcome.

SUMMARY OF THE INVENTION

We have discovered that this objective, and other useful advantages, can be obtained where the image-wise exposed imaging element is developed by passage through at least one treatment cell in a processing apparatus containing the single developing fluid.

According to a first aspect of the invention, there is provided a method of making a lithographic printing plate comprising the steps of:

(1) image-wise exposing to radiation or heat an imaging element comprising on a lithographic base at least one radiation sensitive or heat-sensitive layer composition, the composition being such that when exposed and developed, a lithographic surface is formed; and (2) developing the thus obtained image-wise exposed imaging element by contact with a single developing fluid, characterised in that the image-wise exposed imaging element is developed by passage along a plate path through a closed treatment cell in a processing apparatus containing the single developing fluid, wherein the closed treatment cell comprises a housing having an entrance and an exit each closed by a path-defining roller in contact with a reaction surface to form a nip therebetween, through which the plate path extends, and sealing means sealing each path-defining roller to the housing.

The invention enables quality control of the plate to be possible before it is mounted on the printer. In contrast to the prior art methods in which the plate is developed on the press, debris from the development process is no longer able to disturb the quality of printing. A clean printing system is therefore achievable. Furthermore, by virtue of the treatment liquid being in a closed system, evaporation, oxidation and carbonisation thereof is significantly reduced.

The imaging element may take a number of forms.

In one embodiment, the radiation sensitive layer is a photosensitive layer and the imaging element is image-wise exposed to visible light or ultra-violet radiation. In this embodiment, the imaging element may comprise on a support selected from aluminium, especially anodised aluminium, glass, paper and plastics film, in the order given (i) an ink-repellant layer comprising a cross-linked hydrophilic binder and (ii) a photosensitive layer comprising a photosensitive composition comprising diazo compounds such as the azide compounds disclosed in British patent Nos. GB 1235281 and 1495861; those containing photo-crosslinkable photopolymers such as described in United States patent U.S. Pat. No. 4,072,528 and U.S. Pat. No. 4,072,527; those containing DTR (diffusion transfer) materials; and in particular those described in more detail below.

As hydrophilic binder in the ink repellant layer there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinyl methyl ether copolymers or natural binders such as gelatin, a polysaccharide such as e.g. dextran, pullulan, cellulose, arabic gum, alginic acid. The hydrophilicity of the (co) polymer or (co)polymer mixture used is preferably the same as or higher than the hydrophilicity of polyvinyl acetate hydrolysed to at least an extent of 60 percent by weight, preferably 80 percent by weight.

A hydrolysed tetra alkyl orthosilicate cross-linking agent may be used to cross-link the hydrophilic binder. However, other cross-linking agents can be used such as e.g. a formaldehyde, glyoxal, polyisocyanate or a hydrolysed tetra-alkylorthosilicate. Examples of hydrolysed tetra alkyl orthosilicate cross-linking agents are hydrolysed tetraethyl orthosilicate and hydrolysed tetra methyl orthosilicate. The amount of cross-linking agent, in particular of tetra alkyl orthosilicate, is preferably at least 0.2 parts by weight per part by weight of hydrophilic binder, preferably between 0.5 and 5 parts by weight, more preferably between 1.0 parts by weight and 3 parts by weight.

The ink repellant layer in the imaging element preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the ink repellant layer is given a uniform rough texture consisting of microscopic hills and valleys, which serve as storage places for water in background areas. The thickness of the ink repellant layer may vary in the range of 0.2 to 25 $\mu$m and is preferably 1 to 10 $\mu$m. Particular examples of suitable ink-repellant layers for use in accordance with the present invention are disclosed in EP-A 601240, GB-P-1419512, FR-P-2300354, U.S. Pat. No. 3,971,660, U.S. Pat. No. 4,284,705 and EP-A 514490.

Examples of the low-molecular weight diazonium salt include: benzidine tetrazonium chloride, 3,3'-dimethyl benzidine tetrazonium chloride, 3,3'-dimethoxy benzidine tetrazonium chloride, 4,4'-diamino diphenyl amine tetrazonium chloride, 3,3'-diethyl benzidine tetrazonium sulphate, 4-amino diphenyl amine diazonium sulphate, 4-amino diphenyl amine diazonium chloride, 4-piperidino aniline diazonium sulphate, 4-diethyl amino aniline diazonium sulphate and oligomeric condensation products of diazo diphenyl amine and formaldehyde. Examples of the diazo resins include condensation products of an aromatic diazonium salt as the light-sensitive substance. Such condensation products are known and are described, for example, in German Patent No. 1214086. They are in general prepared by condensation of a polynuclear aromatic diazonium compound, preferably of substituted or unsubstituted diphenyl amine-4-diazonium salts, with active carbonyl compounds, preferably formaldehyde, in a strongly acid medium. Examples of aryl diazol sulphonate resins are disclosed in EP-A 339393 and EP-A 507008, the teaching of which is incorporated herein by reference.

A photo-cross-linking polymer having maleimido group at its side chain(s) includes, for example, polymers described in united States patent U.S. Pat. No. 4,079,041 (corresponding to Japanese unexamined published application JP-A-52988, West German patent DE 2626769, European patents EP 21019 and 3552, Die Angewantdte Makromoleklare Chemie, 115 (1983) pp 163–181; JP-A-49128991 to JP-A-49128993, JP-A-505376 to JP-A-505380, 535298 to JP-A-535300, JP-A-5050107, J?-A-5147940, JP-A-5213907, JP-A-5045076, JP-A-52121700, JP-A-5010844, JP-A-5045087, JP-A-5843951 and West German patents DE 2349948 and 2616276. Of these polymers, those having, at their side chains, two or more maleimido groups on average in one molecule and having a mean molecular weight of 1000 or more are preferably used.

Embodiments which use the DTR process, may use a two-sheet or a mono-sheet method.

In a two-sheet method, a sheet material comprising a silver halide material is image-wise exposed and then contacted with a second sheet material comprising an image receiving layer with physical development nuclei. The sandwich of the two sheets is then processed and during this processing silver ions migrate to the image receiving layer and are precipitated on the physical development nuclei.

In a mono-sheet method, both the silver halide layer and the image receiving layer are present in the same sheet material.

The photosensitive layer preferably also contains dispersed water-insoluble polymers. The aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier. Suitable polymers include homopolymers and copolymers of styrene, methyl acrylate, ethyl acrylate, butyl acrylate, methyl methacrylate, ethyl methacrylate, butyl methacrylate, vinyl acetate, vinyl chloride, vinylidene chloride, butadiene, methyl styrene, vinyl toluene, dimethyl aminoethyl acrylate, acrylic acid, methacrylic acid, isoprene, chloroprene, maleic anhydride, ethylene glycol acrylates such as polyethylene glycol acrylate, halogenated vinyl aromatics such as chlorostyrene and bromo styrene, methyl vinyl ether, vinyl pyrrolidone, polyurethane and the like. Among the cationic and nonionic emulsifiers which can be used are: ammonium salts of substituted amines containing alkyl and/or aryl groups attached to the nitrogen, alkyl or aryl sulphonium salts, alkyl and alkyl-aryl polyethers, cationic or nonionic fluoro surfactants and polyols.

The thickness of the photosensitive layer in the material of this invention may vary in the range of 0.1 to 10 $\mu$m and is preferably between 0.5 and 2.5 $\mu$m.

The photosensitivity of an imaging element in connection with the present invention is preferably such that an exposure to daylight to an extent of not more than 250000 lux.s does not substantially result in changes in the lithographic behaviour of the printing plate. This will allow sufficient convenience in handling and mounting of an image-wise exposed imaging element. The photosensitivity of the imaging element may be easily adapted by appropriate choice of a particular diazo resin or diazonium salt, the amount thereof and the thickness of the photosensitive layer.

The imaging element advantageously contains water-soluble dyes such as rhodamines, Sudan blue, methylene blue, eosin or triphenylmethane dyes such as crystal violet, victoria pure blue, malachite green, methyl violet and fuchsin or dye pigments. These colorants may be incorporated in the photosensitive layer and/or ink-repellant layer.

Various plastic film supports may be used for the imaging element provided it has been treated to provide a surface to which the ink-repellant layer can be applied and adheres. Examples of such supports are photographic film bases e.g. substrated polyethylene terephthalate film, cellulose acetate film, polystyrene film, polycarbonate film etc. The plastic film support may be opaque or transparent. A polyester film support may be used to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is 200 mg per m² and 750 mg per m². Further, the ratio of silica to hydrophilic binder is preferably more than 1 and the surface area of the colloidal silica is preferably at least 300 m² per gram, more preferably a surface area of 500 m² per gram.

The imaging element may comprise additional layers. In particular it is preferred to include an intermediate layer between the ink-repellant layer and the photosensitive layer to improve the ability to develop the imaging element. A particular suitable intermediate layer for this purpose is disclosed in EP-A 601240 and comprises an organic compound having cationic groups. The organic compounds having cationic groups are preferably hydrophilic and may be low molecular weight compounds but are preferably polymers. Preferred compounds are those having one or more ammonium groups or amino groups that can be converted to ammonium groups in an acidic medium. An especially preferred type of cationic compounds are polysaccharides modified with one or more groups containing an ammonium or amino group.

The image-wise exposure of the imaging element advantageously proceeds with ultraviolet light optionally in combination with blue light in the wavelength range of 250 to 500 nm.

Useful exposure sources are high or medium pressure halogen mercury vapour lamps, e.g. of 1000 W, cathode ray tubes, light emitting diodes (LEDs) or lasers. Examples of lasers that can be used in connection with the present invention are e.g. HeNe lasers, Argon ion lasers, semiconductor lasers, and YAG lasers such as Nd-YAG lasers.

Since most lithography is done by the offset process, the imaging element is exposed in such a way that the image obtained thereon is right reading. The exposure may be an exposure using optics or a contact exposure.

In an alternative embodiment, the radiation sensitive layer is a thermosensitive layer and either the imaging element is image-wise exposed to infra-red radiation or is image-wise heated by conduction, for example by using a thermal head. In this alternative the imaging element may comprise on a hydrophilic surface of a lithographic base an image forming layer comprising hydrophobic thermoplastic polymer particles dispersed in the hydrophilic binder. The hydrophilic binder of the image forming layer used in this embodiment is preferably not cross-linked or only slightly cross-linked. The lithographic base comprises a flexible support, such as e.g. paper or plastic film, provided with an ink-repellant layer comprising a cross-linked hydrophilic binder.

The image forming layer in this embodiment comprises hydrophobic thermoplastic polymer particles dispersed in the hydrophilic binder. The hydrophobic thermoplastic polymer particles preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. When the polymer particles are subjected to a temperature above coagulation temperature they coagulate to form a hydrophobic agglomerate in the hydrophilic layer so that at these parts the hydrophilic layer becomes insoluble in plain water or an aqueous liquid.

Specific examples of hydrophobic thermoplastic polymer particles are e.g. polyethylene, polyvinyl chloride, polymethyl (meth)acrylate, polyethyl (meth)acrylate, polyvinylidene chloride, polystyrene polyacrylonitrile, polyvinyl carbazole etc. or copolymers thereof. Most preferably used is polymethyl (meth)acrylate or polystyrene. The weight average molecular weight of the polymers may range from 5,000 to 1,000,000 g/mol. The hydrophobic particles may have a particle size from 0.01 μm to 50 μm, more preferably between 0.05 μm and 10 μm and most preferably between 0.05 μm and 2 μm.

The polymer particles are present as a dispersion in the aqueous coating liquid of the image forming layer and may be prepared by the methods disclosed in United States patent U.S. Pat. No. 3,476,937. Another method especially suitable for preparing an aqueous dispersion of the thermoplastic polymer particles comprises dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image forming layer is preferably more than 30% by weight, more preferably at least 50% by weight and most preferably at least 65% by weight.

The thermosensitive layer may comprise a driographic material. This driographic material may comprise a glass support, the glass being at most 0.5 mm thick and having a failure stress of at least $10^7$ Pa and a Young's modulus of not more than $10^{11}$ Pa. Although it is possible to implement any driographic material for producing lithographic printing plates on a glass support, it is preferred to use driographic materials as described in European patent EP 573091. The main advantage of these driographic materials is the fact that the need for the use of an organic solvent in the development is avoided or that at least ecologically more acceptable solvents can be used.

In this embodiment, the imaging element is image-wise heated with a thermal head, e.g. in a thermal printer. The diazonium salt, diazo resin or aryldiazosulphonate resin offers the advantage that subsequent to image-wise heating and development the printing properties, in particular the ink uptake by the image-areas, can be improved by applying an overall UV exposure to the developed imaging element.

According to a second aspect of the invention, there is provided an apparatus for making a lithographic printing plate by exposing and processing an imaging element, comprising (i) an exposing part in which the imaging element is image-wise exposed, and (ii) a processing part comprising a closed liquid treatment cell adapted to contain a single developing fluid in which the imaging element is wet processed, characterized in that the closed treatment cell comprises a housing having an entrance and an exit each closed by a path-defining roller in contact with a reaction surface to form a nip therebetween, through which the plate path extends, and sealing means for sealing each path-defining roller to the housing, and means for automatically feeding the exposed imaging element from the exposing part into and through the processing part.

By integrating an exposing part and a processing part within one and same handling system, only one controlling system may be sufficient, thus further reducing costs and increasing the reliability of the system. From this point of view, reference may be given to European patent application 95200883.7 (Agfa-Gevaert NV) which describes a diagnosing method to find the cause of a problem of bad performance of a printing plate, and to European patent application 95200884.5 (Agfa-Gevaert NV) which describes a method for remotely monitoring and optionally adjusting operation of a lithographic printing plate processor.

The entrance and the exit to the treatment cell are each closed by a path-defining roller in contact with a reaction surface to form a nip therebetween, through which the plate path extends. The reaction surface can be a stationary surface having a low coefficient of friction, but is more preferably a moving surface, such as the surface of a belt or a further path-defining roller. Thus, the liquid treatment cell preferably includes a pair of path-defining rollers in contact with each other to form a nip through which the exposed imaging element passes, the path-defining rollers comprising a core carrying an elastomeric covering.

Typical path-defining rollers have a core provided with a covering of elastomeric material, although it is possible for the path-defining to be elastomeric throughout its cross-section. As the imaging element leaves a given liquid treatment vessel it is necessary to remove any liquid carried on the imaging element as efficiently as possible, to prevent wasteful carry-over of liquid and to reduce edge effects which arise from non-homogeneous chemistry on the imaging element after squeegeeing. To do this job properly, the path-defining rollers must exert a sufficient and homogeneous pressure over the whole width of the imaging element. Also, to reduce edge effects, it is desirable that the opposite path-defining surfaces are in contact with each other beyond the edges of the imaging element. To put this problem in context, rollers used in conventional processing apparatus for example have a length of 400 mm and a diameter of from 24 to 30 mm. The imaging element typically has a width of from a few millimeters up to 2 mm and a thickness of 0.05 mm to 0.5 mm. In view of the nature of elastomeric material, it is in fact impossible to totally eliminate any gap between the roller surfaces at the edges of the imaging element as it passes through the nip. It is desirable that the roller surfaces be in contact with each other within as short a distance as possible from the edges of the imaging element i.e. that the size of the leak zone should be minimised. It is important however that the force between the path-defining rollers is sufficient to prevent leakage when no imaging element is passing through. However, the force must not be so high as to risk physical damage to the imaging element as it passes through the nip.

The objective of a minimum leak zone referred to above can be achieved if the ratio of the diameter of the path-defining to its length is above a critical limit.

According to a preferred embodiment of the invention therefore, at least one of the path-defining rollers, and preferably each path-defining, comprises a rigid core carrying a covering of elastomeric material, the ratio ($\phi/L$) of the maximum diameter ($\phi$) of the elastomeric material covering to the length (L) thereof being at least 0.012, most preferably between 0.03 and 0.06. Where the reaction surface towards which the path-defining is biased to define the nip is the surface of another path-defining, it is preferred that the path-defining requirements referred to above apply to this, second, roller also. Indeed, it will be usual for the two path-defining rollers to be identical, although it is possible that the diameters ($\phi$), and therefore the ratios ($\phi/L$), of the two path-defining rollers need not be identical. It is also possible that the reaction surface may be formed by the surface of a second path-defining which does not conform to the above requirements, such as for example, a roller having no elastomeric covering, or for the reaction surface to be in the form of a belt.

The elastomeric material covering preferably has a thickness of between 1 mm and 30 mm. The elastomeric material may be selected from ethylene/propylene/diene terpolymers (EPDM), silicone rubber, polyurethane, thermoplastic rubber such as Santoprene (Trade Mark for polypropylene/EPDM rubber), styrene-butyl rubber and nitrile-butyl rubber. The hardness of the elastomeric material may be between 15 Shore (A) and 90 Shore (A), as measured on the roller surface. In one embodiment of the invention, the diameter ($\phi$) of the elastomeric material covering is constant along the length of the roller. Alternatively the path-defining may have a radial dimension profile which varies along the length thereof. In the latter case, the diameter ($\phi$) in the expression $\phi/L$ is the maximum diameter. In a preferred embodiment, such a path-defining comprises a non-deformable core, the thickness of the elastomeric material covering varying along the length thereof. Alternatively or additionally, the diameter of the core varies along the length thereof.

Ideally, the radial dimension profile of such a path-defining is such in relation to the force applied by the roller to the imaging element passing through the nip as to be substantially even over the width thereof.

The radial dimension of the path-defining ideally decreases towards the ends thereof i.e. a convex profile, especially a parabolic profile.

Preferably, the core has a flexural E-modulus of between 50 GPa and 300 GPA. Suitable materials for the rigid core include metals, such as stainless steel, non-ferrous alloys, titanium, aluminium or a composite thereof.

In one embodiment of the invention, the core is hollow. Alternatively the core may be solid.

The path-defining rollers may be biased together by a variety of methods. The rollers may be biased together for example by making use of the intrinsic elasticity of the elastomeric material, by the use of fixed roller bearings. Alternatively, use may be made of resilient means such as springs which act on the ends of the roller shafts. The springs may be replaced by alternative equivalent compression means, such as e.g. a pneumatic or a hydraulic cylinder.

The treatment cell comprises sealing means sealing each path-defining path-defining to the housing. The sealing arrangement, for each path-defining roller, may be selected from stationary sealing devices and rotatable sealing devices. For example, stationary sealing devices carried on the housing and extending into contact with the surface of an associated path-defining roller may be used. More preferably, rotatable sealing devices are used, each in the form of a sealing roller carried by the housing and in contact with the path-defining roller. The manner of mounting the sealing rollers in the housing may be similar to that described in European patent applications EP-0 779 548 (Agfa-Gevaert NV), EP-A 97.201.052 (Agfa-Gevaert NV), or EP-A 97.201.814 (Agfa-Gevaert NV).

The processing part of the apparatus may comprise a single liquid treatment cell, through which the developing fluid may be circulated. Alternatively, the processing part comprises a plurality of liquid treatment cells, in liquid communication with each other. In the latter arrangement, the developing fluid may flow from cell to cell in counter-current to the direction of movement of the exposed imaging element. In either arrangement, ideally the circulating developing fluid is filtered.

The processing part may include a drying cell positioned downstream of the liquid treatment cell(s).

The processing part may comprises a substantially vertical path. By this arrangement, the quotient of a throughput of processed imaging elements (expressed in square meter per hour $m^2/h$) to a ground area (expressed in square meter m$^2$) occupied by the apparatus can be higher than 10 h$^{-1}$. The throughput of processed imaging elements is preferably defined at a resolution of 1200 dpi.

The exposing part may comprise an image setter.

The apparatus may further comprise outputting means for laying down the processed imaging element in an exit tray at the operator's side of the apparatus. Turning means may be provided for laying down the processed imaging element in an exit tray, either face up, either face down.

The processing part of the apparatus may include a separate entry for pre-exposed imaging elements, for example contained in a light-proof and/or heat-proof cassette either in the form of sheets or a web. It is also possible for the exposing part to include a separate entry for removing exposed imaging elements, for example contained in a light-proof and/or heat-proof cassette, before they are passed through the processing part, for processing on a separate apparatus if desired.

Usually, the developing fluid is an aqueous liquid. This liquid may consist essentially of water, that is free of additives, or the developing fluid includes an additive selected from anti-foams, anti-algae agents, pH control agents i.e. buffers, co-solvents (such as benzyl alcohol or phenyl ethyl alcohol), surfactants, gumming agents and mixtures thereof.

To prevent the formation of "algae slimes" which can consist of algae, bacteria and/or fungi, biocides can be added to the developing liquid. The biocides can be added in the form of powder, granulates or tablets, which slowly release the active ingredient, which is usually a bromine or chlorine derivative. A dedicated holder for the biocide may be provided in the processing part of the apparatus. Hypochlorite bleach is an effective biocide, but can be corrosive to stainless steel. More useful biocides include benzoates, phosphonates with sequestering ability, e.g. Turpinal 2NZ™, Preventol™/Solbrol™ Bayer AG, especially Preventol R50™, Preventol O™ and Preventol D7™, and stabilised ClO$_2$ biocides such as Bio-Zyme-PP-CL™ ex KAM Biotechnology.

Biocide products which also have an influence on the final quality of the processed imaging element are also useful, including products which improve the archivability of silver-containing products, such as thiocyanates and bisulphites.

The addition of complexing agents, such as carboxylates such as citrates, EDTA, and phosphonates such as HEDP, help prevent discolouration. Compounds which influence the hydrophilic/hydrophobic balance such as surfactants, polyethylene oxides, gums and hydrophobizing agents can also be added. Acids and alkalis can be added to adjust the pH of the developing liquid, ideally to the I.E.P of the polymer used, and aluminium ions stabilised with boron compounds or carboxylates, can be added to improve dimensional stability. The addition of surfactants improves the surface tension so that the liquid film on the first rollers of the dryer is well spread to prevent dirt marks on the processed material.

Preferably high developing liquid flow rates through the treatment cell(s), by high circulation rates or high replenishment rates, is used to prevent adhesion of micro-organisms to rollers, drains etc.

Regular cleaning of the apparatus avoids the build up of micro-organisms. Other methods of preventing micro-organism build up in the developing liquid, such as heating to 45° C. or more, or exposure to UV radiation or to ozone, may also be considered.

DETAILED DESCRIPTION OF THE INVENTION

The invention will be described by the following illustrative embodiments with reference to the accompanying drawings without the intention to limit the invention thereto, and in which.

Figure 1:
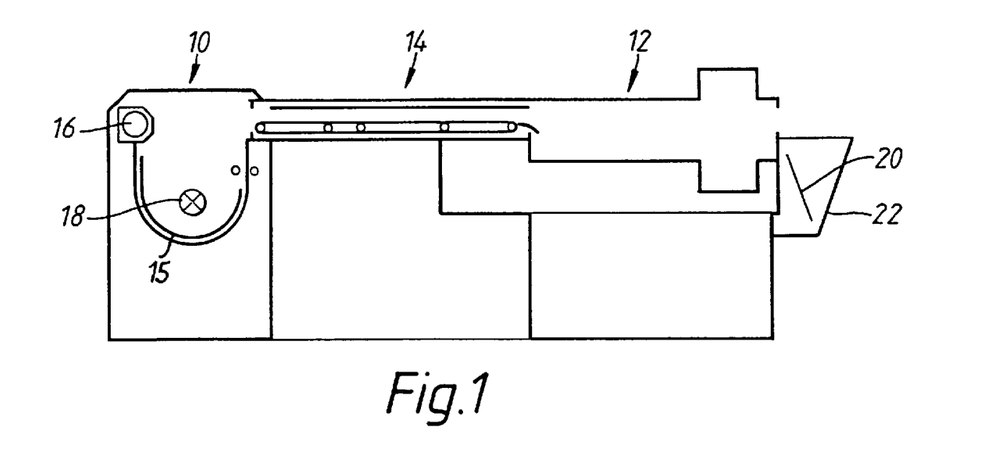
FIG. 1 shows a general view of an apparatus according to the invention, with a horizontal processing part.

Referring to FIG. 1, the apparatus includes an exposing part 10 and a processing part 12, disposed side by side and interconnected by a bridging part 14. Specifically, in the exposing part 10 an imaging element 15, e.g. a photographic film or paper in the form of a roll, is placed in a magazine 16 (e.g. with a 60 meter supply) and positioned at an exposure stage 18. The photographic material thus exposed is separated into individual images with a cutter (not shown), and each separated sheet is fed in turn to the processing part 12 where it is developed. The thus developed photographic material 20 is then ejected to a print outlet 22.

Figure 2:
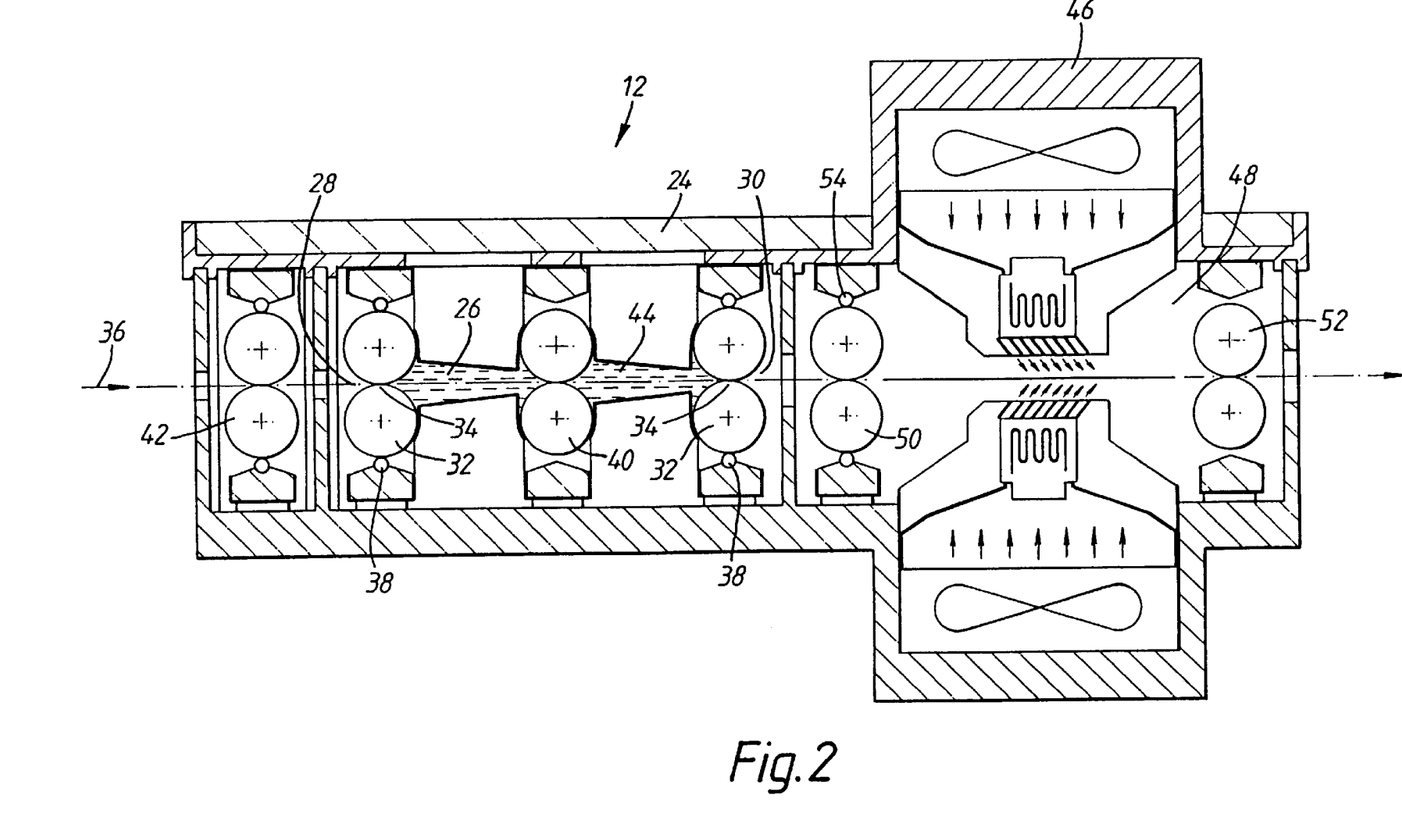
FIG. 2 show a longitudinal cross-section of the horizontal processing part of the apparatus shown in FIG. 1.

FIG. 2 show a longitudinal cross-section of the horizontal processing part 12 of the apparatus. The processing part comprises a housing 24 which is so shaped as to define a treatment cell 26 therein. The treatment cell 26 has an entrance 28 and an exit 30 each of which is closed by a pair of path-defining rollers 32, 33 urged together to form a nip 34 therebetween through which a sheet material path 36 extends. Each path-defining roller 32, 33 is sealed to the housing 24 by way of a sealing roller 38, which contacts its associated path-defining roller at a position approximately 180° from the nip 34. The treatment cell 26 also includes a pair of intermediate rollers 40 which need not be sealed to the housing, but as driven rollers assist in the transportation of the sheet material through the treatment cell. The processing part is sealed by a pair of closing rollers 42 which prevent contact between the treatment liquid 44 and the environment to reduce evaporation of the liquid and/or its contamination by the environment.

The processing part 12 of the apparatus also includes a dryer 46 positioned downstream of the treatment cell 26. The dryer comprises a drying chamber 48 into which dry heated air is directed in a known manner. The drying chamber 48 is closed by entrance and exit driven roller pairs 50 and 52 respectively. The entrance roller pair 50 are sealed by sealing rollers 54 and therefore serve to restrict any flow of hot air from the dryer to the treatment cell. The exit roller pair 52 need not be so sealed if, as will usually be the case, the drying chamber 48 is operated at a slight positive pressure preventing the leakage of ambient air into the drying chamber.

Figure 3:
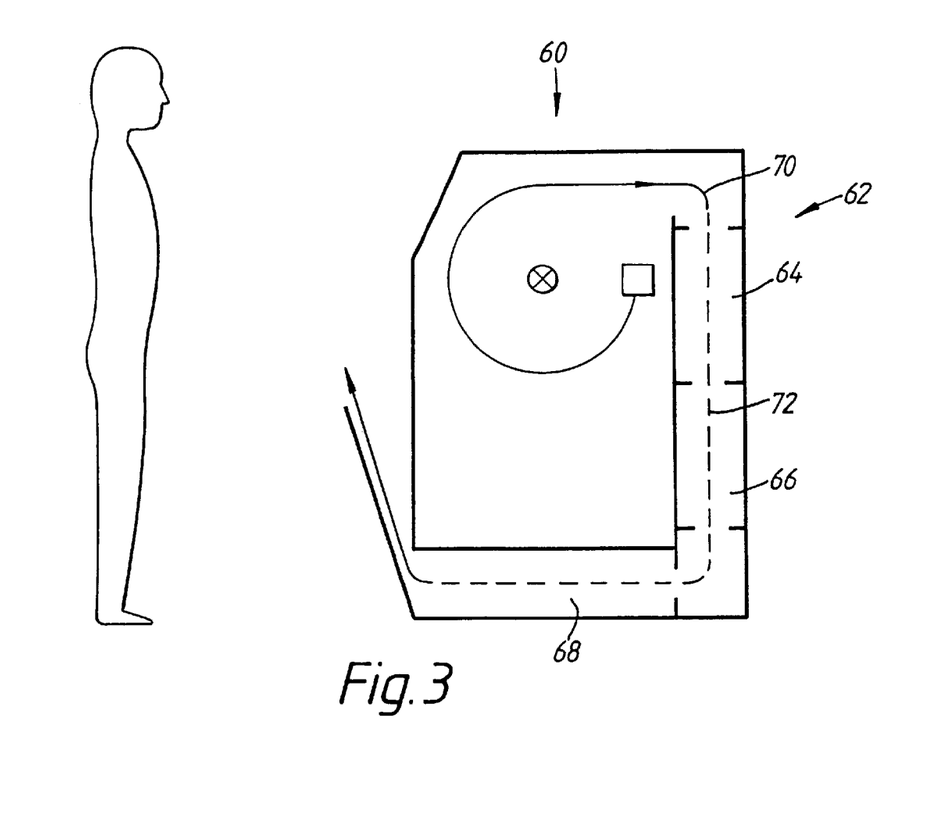
FIG. 3 shows a general view of an apparatus according to the invention, with a vertical processing part.

FIG. 3 shows a general view of an alternative apparatus which comprises an exposing part 60 in which the imaging element is image-wise exposed, and a vertical processing part 62 in which the imaging element is wet processed. The exposing part 60 is, for example, an image setter. The exposed imaging element is fed automatically from the exposing part 60 into the processing part 62. The exposing part 60 and the processing part 62 are fully integrated into one recording apparatus within one common housing.

The vertical processing part 62 comprises two superimposed treatment cells 64 and 66 and a drying unit 68 below the lowermost treating unit 66. A mechanical deflector 70 is used to guide imaging elements along an arcuate path towards and into the uppermost treating unit 64. The vertical path along which the imaging elements are caused to advance through the units 64 and 66 and the drying unit 68 is indicated by the phantom line 72.

Figure 4:
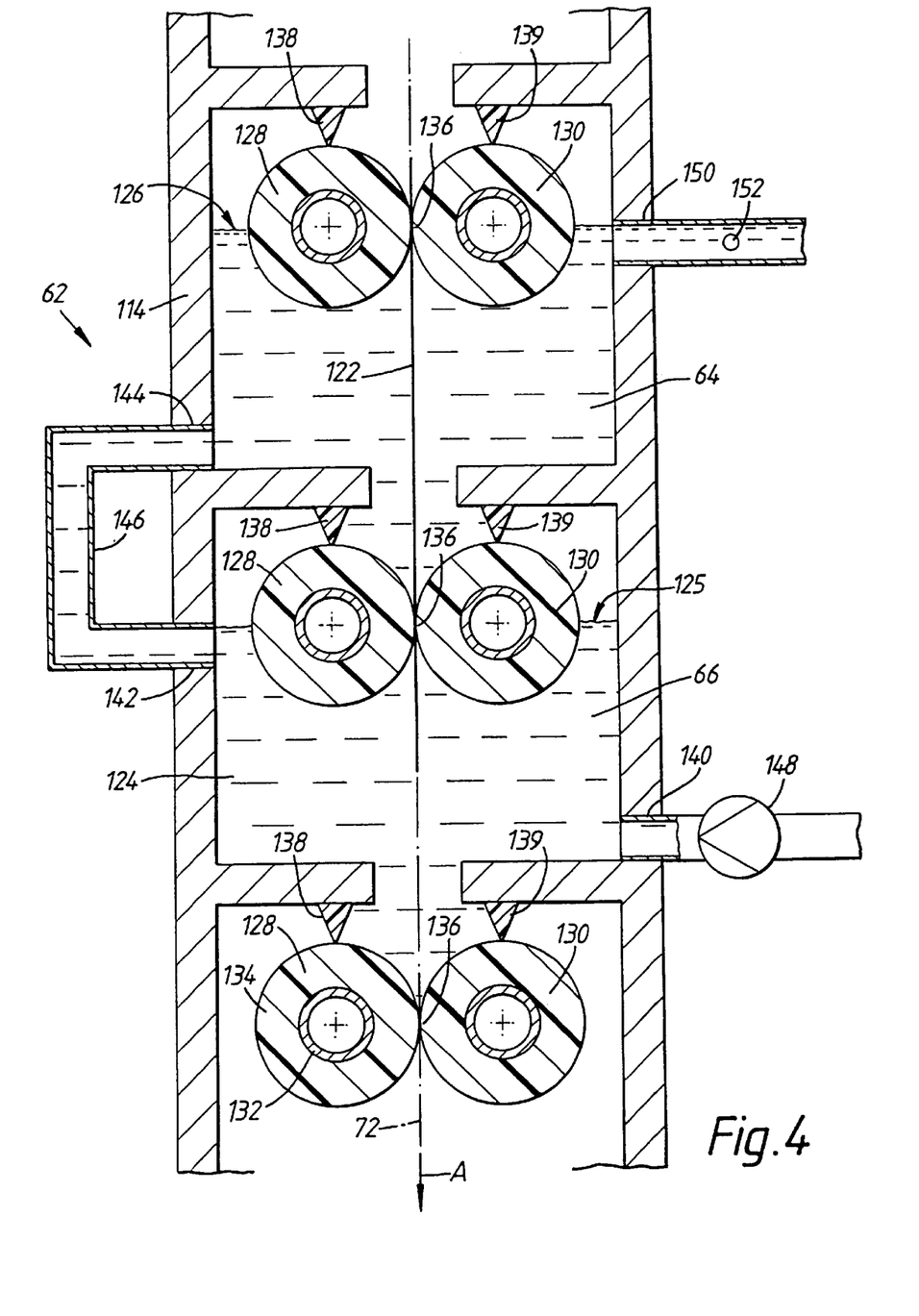
FIG. 4 shows a longitudinal cross-section of part of the vertical processing part of the apparatus shown in FIG. 1.

The processing part 62 of the apparatus is shown in more detail in FIG. 4. The closed treatment cells 64, 66 are mounted one above the other in the stack to define the substantially vertical imaging element path 72 through the cells in sequence, the imaging element 122 moving in a downwards direction as indicated by the arrow A.

Cells 64 and 66 represent a cascade of developing cells in which the imaging element is developed. The cascade as shown consists of only two cells but further cells could be added as desired. The first cell 64 is referred to herein as the preceding cell, the second cell 66 as the following cell.

Each cell comprises a housing 114 within which is defined an entrance 116 and an exit 118, each being closed by a first rotatable roller 128 biased towards the reaction surface in the form of a second rotatable roller 130 to define the roller nip 136 there-between through which the imaging element path 72 extends. Each roller 128, 130 is of the squeegee type comprising a stainless steel hollow core 132 carrying an elastomeric covering 134. The core 132 is in cylindrical form having constant internal and external diameters along the length thereof. The rollers 128, 130 are biased towards each other with a force sufficient to effect a liquid tight seal but without causing damage to the imaging element 122 as it passes there-between.

The line of contact between the roller surfaces defines the nip 136. The imaging element preferably has a width which is at least 10 mm smaller than the length of the nip, so as to enable a spacing of at least 5 mm between the edges of the sheet and the adjacent limit of the nip 136, thereby to minimise leakage. The rollers 128, 130 are coupled to drive means (not shown) so as to constitute drive rollers for driving the imaging element 122 along the imaging element path 72.

Each cell further comprises associated sealing members diagrammatically indicated at 138 and 139, the sealing members being secured to the housing 114 and serving to provide the gas- and liquid-tight seal between the rollers 128, 130 on the one hand and the housing 114 on the other. The treatment liquid 124 is therefore retained in each cell by the rollers 128, 130 and the sealing members 138, 139. Thus, treatment liquid from cell 64 is prevented from falling into the lower cell 66 by the rollers 128, 130 and sealing members 138, 139, while vapours from the lower cell 66 are prevented from escaping into the environment. This construction has the advantage that the treatment liquid in any one cell is not contaminated by the environment and that by virtue of the treatment liquids being in a closed system evaporation, oxidation and carbonisation thereof is significantly reduced (and any other undesirable exchange between the treatment liquid and the environment).

The following cell 66 has a treatment liquid inlet 140 and a treatment liquid outlet 142, the treatment liquid outlet 142 being connected to a treatment liquid inlet 144 of the immediately preceding cell 64 by way of a connecting passage 146. The connecting passage 146 is constituted by additional pipework.

A treatment liquid pump 148 is connected to the inlet 140 of the following cell 66 to cause flow of treatment liquid 124 in sequence through the following cell 66, through the connecting passage 146 and through the preceding cell 64. The passage 146 is narrow enough to limit the reverse diffusion from the preceding cell 64 to the following cell 66 when the pump 148 is not operating. However, the passage 146 is not so narrow as to significantly restrict the flow of treatment liquid 124 in the operational direction when the pump 148 is operating.

A filter (not shown) may be located in the passage 146. As shown, the treatment liquid inlet 144 of the preceding cell 64, is below the level 126 of treatment liquid therein. It is also possible to place the inlet 144 above the level 126, such an arrangement leading to the advantage that reverse diffusion is prevented.

The treatment liquid outlet 142 of the following cell 66 is located as to ensure that the rollers 128, 130 are wetted by treatment liquid 124 in the following cell 66.

The preceding cell 64 also has a treatment liquid outlet 150. A liquid level sensor 152, connected to the outlet 150 of the preceding cell 64 ensures the filling of the preceding cell 64 and the following cell 66 with treatment liquid 124 to predetermined levels. The predetermined level 125 of treatment liquid 124 in the following cell 66 is defined by the position of the treatment liquid outlet 142. The predetermined level 126 of treatment liquid 124 in the preceding cell 64 is defined by the position of the treatment liquid outlet 150.

In use, the imaging element 122 is passed along the imaging element path 72 in sequence through the closed treatment cells 64, 66. Treatment liquid 124, as set out the examples given below, is fed to the treatment liquid inlet 140 of the following cell 66. The treatment liquid 124 is passed, under force of the pump 148, from the treatment liquid outlet 142 of the following cell 66 to the treatment liquid inlet 144 of the preceding cell 64 by way of the connecting passage 146.

In a modification, the rollers 128, 130 may be mounted in such a manner as to be capable of being moved away from each other. Such a modified apparatus may be cleaned periodically by using the pump 148 to pump a cleaning liquid, such as water, into the cells and then moving the rollers of each pair 128, 130 away from each other to allow the cleaning liquid to drain from the apparatus, or from selected cells thereof.

The apparatus shown in FIGS. 3 and 4 occupies only a fraction of the floor space occupied by a horizontal arrangement.

The invention will now be illustrated in the following non-limiting examples.

EXAMPLE 1

A lithographic base is prepared as follows. To 440 g of a dispersion containing 21.5% $TiO_2$ (average particle size 0.3 to 0.5 $\mu$m) and 2.5% polyvinyl alcohol in deionized water is subsequently added, while stirring, 250 g of a 5% polyvinyl alcohol solution in water, 105 g of a hydrolysed 22% tetra methyl orthosilicate emulsion in water and 12 g of a 10% solution of a wetting agent. To this mixture is added 193 g of deionized water and the pH is adjusted to pH=4. The obtained dispersion is coated on a polyethyleneterephthalate film support (coated with a hydrophilic adhesion layer) to a wet coating thickness of 50 g/m², dried at 30° C. and subsequently hardened by subjecting it to a temperature of 57° C. for 1 week. To this base is further provided an aqueous solution (pH=5) of Dormacid (a dextran modified with a diethyl aminoethyl group available from Pfeifer & Langen) and a cationic wetting agent to a dry coating thickness of 100 mg Dormacid per m². The obtained element is then heated for 1 week at 57 C.

An imaging element is produced by coating a light sensitive composition onto the lithographic base in an amount of 35 g/m² (wet coating amount) and drying it at 30° C.

The light sensitive coating is prepared as follows. To 63 g of a 20% dispersion of polymethyl methacrylate (particle diameter of 40 nm) stabilized with cetyl trimethyl ammonium bromide in deionized water is subsequently added, while stirring, 120 g of a 5% solution of a 98% hydrolysed polyvinyl acetate, having a number average molecular weight of 200,000 g/mol (MOWIOL™ 56–98 available from Hoechst), in water and 15 g of a 10% dispersion of Heliogen™ blue (BASF) and 5% polyvinyl alcohol (MOWIOL™ 56–98) in water. 46 g of a 15% solution of the condensation product of diphenyl amine diazonium salt and formaldehyde (NEGALUX™ N18 available from PACS) and 20 g of a 15% solution of the condensation product of methoxy-diphenyl amine diazonium salt and formaldehyde (DIAZO No. 8 available from Fairmount) in water is then slowly added. Finally 30 g of a 1.6% solution of cationic fluor-containing surfactant (Fluorad™ FC135 available from 3M) in water, and 726 ml of water are added.

A printing plate is prepared by exposing the imaging element through an original (mask) to a high pressure halogen mercury vapour lamp of 1000 Watt at a distance of 70 cm for 90 s. The exposed imaging plate is then developed in an apparatus as shown in FIG. 4 using a developing liquid having a pH of about 4.5 and comprising an aqueous base containing a wetting agent, a biocide and a buffering agent (such as citric acid), whereby non-exposed parts thereof are washed off. The printing plate is then mounted on an AB Dick 360™ offset press. Van Son RB2329™ ink and G671c™ dampening liquid (ex Agfa Gevaert NV) are used. Good prints are obtained during printing without ink uptake in the non-image areas.

EXAMPLE 2

An imaging element is produced by coating a heat-sensitive composition onto the lithographic base described in Example 1 in an amount of 35 g/m² (wet coating amount) and drying it at 30° C. The coating composition is prepared by adding 120 g of a 5% solution of a 98% hydrolysed polyvinyl acetate in water, and 15 g of a 10% dispersion of Heliogen™ blue (BASF) and 5% polyvinyl alcohol (MOWIOL™ 56–98) in water, to 63 g of a 20% dispersion of polymethyl methacrylate (particle diameter of 40 nm) stabilized with cetyl trimethyl ammonium bromide in deionized water. The hydrolysed polyvinyl acetate has a number average molecular weight of 200,000 g/mol (MOWIOL™ 56–98 available from Hoechst). 46 g of a 15% solution of the condensation product of diphenyl amine diazonium salt and formaldehyde (NEGALUX™ N18 available from PACS) and 20 g of a 15% solution of the condensation product of methoxy-diphenyl amine diazonium salt and formaldehyde (DIAZO No. 8 available from Fairmount) in water is then slowly added. Finally 30 g of a 1.6% solution of cationic fluor-containing surfactant (Fluorad™ FC135 available from 3M) in water, and 726 ml of water is added.

A printing plate is prepared by image-wise heating the imaging element in a DRYSTAR™ MATRIX™ DI2000 thermal printer (commercially available from Agfa-Gevaert NV). The exposed imaging plate is then developed in an apparatus as shown in FIG. 4 using the same developing liquid whereby non-heated parts thereof are washed off. The printing plate is then mounted on an AB Dick 360™ offset press. Van Son RB2329™ ink and G671c™ dampening liquid (ex Agfa Gevaert NV) are used. Good prints are obtained during printing without ink uptake in the non-image areas.

Reference Number List

| | |
|---|---|
| exposing part 10 | exposing part 60 |
| processing part 12 | vertical processing part 62 |
| bridging part 14 | treatment cells 64 and 66 |
| imaging element 15 | drying unit 68 |
| magazine 16 | mechanical deflector 70 |
| exposure stage 18 | vertical path line 72 |
| developed material 20 | housing 114 |
| print outlet 22 | entrance 116 |
| housing 24 | exit 118 |
| treatment cell 26 | imaging element 122 |
| entrance 28 | treatment liquid 124 |
| exit 30 | level 126 |
| path-defining rollers 32, 33 | first rotatable roller 128 |
| nip 34 | second rotatable roller 130 |
| sheet material path 36 | core 132 |
| sealing roller 38 | covering 134 |
| intermediate rollers 40 | nip 136 |
| closing rollers 42 | sealing members 138 and 139 |
| treatment liquid 44 | liquid inlet 140 |
| dryer 46 | liquid outlet 142 |
| drying chamber 48 | liquid inlet 144 |
| entrance roller pair 50 | connecting passage 146 |
| sealing rollers 54 | pump 148 |
| exit roller pair 52 | liguid outlet 150 |
| | sensor 152 |

We claim:
1. A method of making a lithographic printing plate comprising the steps of:
   (1) image-wise exposing to radiation an imaging element comprising on a lithographic base at least one radiation sensitive layer composition, said composition being such that when exposed and developed, a lithographic surface is formed; and
   (2) developing the thus obtained image-wise exposed imaging element by contact with a single developing fluid, characterised in that said image-wise exposed imaging element is developed by passage along a plate path through a closed treatment cell in a processing apparatus containing said single developing fluid, wherein said closed treatment cell comprises a housing having an entrance and an exit each closed by a path-defining roller in contact with a reaction surface to form a nip therebetween, through which said plate path extends, and sealing means sealing each said path-defining roller to said housing.

2. A method according to claim 1, wherein said at least one radiation sensitive layer includes at least one photosensitive layer and step (1) includes image-wise exposing said imaging element to radiation selected from visible light and ultra-violet radiation.

3. A method of making a lithographic printing plate comprising the steps of:
   (1) image-wise exposing to heat an imaging element comprising on a lithographic base at least one heat-sensitive layer composition, said composition being such that when exposed and developed, a lithographic surface is formed; and
   (2) developing the thus obtained image-wise exposed imaging element by contact with a single developing fluid, characterised in that said image-wise exposed imaging element is developed by passage along a plate path through a closed treatment cell in a processing apparatus containing said single developing fluid, wherein said closed treatment cell comprises a housing having an entrance and an exit each closed by a path-defining roller in contact with a reaction surface to form a nip therebetween, through which said plate path extends, and sealing means sealing each said path-defining roller to said housing.

4. A method according to claim 1 or claim 3, wherein said developing fluid is an aqueous liquid.

5. A method according to claim 1, wherein said exposed imaging element is passed through at least two said closed treatment cells in said processing apparatus, said developing fluid flowing from cell to cell in counter-current to the direction of movement of the exposed imaging element.

6. An apparatus for making a lithographic printing plate by exposing and processing an imaging element, comprising:

(a) an exposed part in which said imaging element is image-wise exposed;

(b) a processing part comprising a plurality of closed liquid treatment cells in liquid communication with each other and adapted to contain a single developing fluid in which said imaging element is wet processed;

(c) each of said closed treatment cells comprising a housing having an entrance and an exit, each said entrance and each said exit being closed by a path-defining roller and an opposed reaction surface with which the opposed path-defining roller is in contact to form a nip therebetween, to form a path for said printing plate;

(d) sealing means for sealing each path-defining roller to said housing; and (e) means for automatically feeding said exposed imaging element from said exposing part into and through said processing part.

7. An apparatus according to claim 6, wherein said processing part includes a drying cell positioned downstream of said closed liquid treatment cells.

* * * * *

UNITED STATES PATENT AND TRADEMARK OFFICE
CERTIFICATE OF CORRECTION

PATENT NO.    : 6,004,727
DATED         : December 21, 1999
INVENTOR(S)   : Verlinden et al.

It is certified that error appears in the above-identified patent and that said Letters Patent is hereby corrected as shown below:

Title page,
Item [30] Foreign Application Priority Data, insert
-- [30] Foreign Application Priority Data
   July 28, 1997 [EP] Europe 97202321 --.

Signed and Sealed this

Fourteenth Day of May, 2002

Attest:

JAMES E. ROGAN
Attesting Officer    Director of the United States Patent and Trademark Office